United States Patent
Asano et al.

(10) Patent No.: US 8,872,090 B2
(45) Date of Patent: Oct. 28, 2014

(54) SOLID-STATE IMAGING DEVICE HAVING FLOATING DIFFUSION UNITS DISPOSED AT GREATER INTERVALS THAN ADJACENT ONES OF HORIZONTAL TRANSFER UNITS

(71) Applicant: Panasonic Corporation, Osaka (JP)

(72) Inventors: Takuya Asano, Hyogo (JP); Akira Tsukamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 214 days.

(21) Appl. No.: 13/656,107

(22) Filed: Oct. 19, 2012

(65) Prior Publication Data

US 2013/0043373 A1 Feb. 21, 2013

Related U.S. Application Data

(63) Continuation of application No. PCT/JP2011/001253, filed on Mar. 3, 2011.

(30) Foreign Application Priority Data

Jun. 15, 2010 (JP) ................................. 2010-136653

(51) Int. Cl.
| | |
|---|---|
| *H01L 27/00* | (2006.01) |
| *H04N 5/372* | (2011.01) |
| *H01L 27/148* | (2006.01) |
| *H04N 5/365* | (2011.01) |

(52) U.S. Cl.
CPC ...... *H01L 27/14831* (2013.01); *H04N 5/37213* (2013.01); *H01L 27/14812* (2013.01); *H04N 5/3653* (2013.01)
USPC ..................................... 250/208.1; 250/214 R

(58) Field of Classification Search
USPC ........... 250/208.1, 214 R, 239; 348/296–314, 348/320–322; 257/290–294, 440, 450
See application file for complete search history.

(56) References Cited

U.S. PATENT DOCUMENTS

| | | | |
|---|---|---|---|
| 4,807,037 | A | 2/1989 | Iesaka et al. |
| 5,598,022 | A | 1/1997 | Kyomasu |
| 5,812,192 | A | 9/1998 | Ishigami et al. |
| 6,002,146 | A | 12/1999 | Nakagawa et al. |
| 7,683,956 | B2 * | 3/2010 | Honda et al. ................. 348/311 |

FOREIGN PATENT DOCUMENTS

| | | |
|---|---|---|
| JP | 63-217659 A | 9/1988 |
| JP | 07-066381 A | 3/1995 |

(Continued)

OTHER PUBLICATIONS

International Search Report issued in International Patent Application No. PCT/JP2011/001253 dated Apr. 12, 2011.

*Primary Examiner* — Que T Le
(74) *Attorney, Agent, or Firm* — McDermott Will & Emery LLP

(57) ABSTRACT

A solid-state imaging device includes: a plurality of photoelectric conversion units arranged in rows and columns in a pixel region; a plurality of vertical transfer units arranged for corresponding columns of the photoelectric conversion units, and transfer, in a column direction, the signal charges read from the corresponding columns of the photoelectric conversion units; a first and a second horizontal transfer units arranged in parallel, and transfer, in a row direction, the signal charges transferred by the vertical transfer units; and a first and a second output units which (i) include floating diffusion units each formed in a region adjacent to an output end of a corresponding one of the first and the second horizontal transfer units and (ii) output, as electric signals, the transferred signal charges, wherein the floating diffusion units are disposed at greater intervals than adjacent ones of the horizontal transfer units.

10 Claims, 8 Drawing Sheets

(56) References Cited

FOREIGN PATENT DOCUMENTS

| JP | 07-086543 A | 3/1995 |
| JP | 08-097397 A | 4/1996 |
| JP | 08-335689 A | 12/1996 |
| JP | 09-246519 A | 9/1997 |
| JP | 2004-319576 A | 11/2004 |
| JP | 2006-196729 A | 7/2006 |
| JP | 2009-290722 A | 12/2009 |

* cited by examiner

SOLID-STATE IMAGING DEVICE HAVING FLOATING DIFFUSION UNITS DISPOSED AT GREATER INTERVALS THAN ADJACENT ONES OF HORIZONTAL TRANSFER UNITS

CROSS REFERENCE TO RELATED APPLICATIONS

This is a continuation application of PCT Patent Application No. PCT/JP2011/001253 filed on Mar. 3, 2011, designating the United States of America, which is based on and claims priority of Japanese Patent Application No. 2010-136653 filed on Jun. 15, 2010. The entire disclosures of the above-identified applications, including the specifications, drawings and claims are incorporated herein by reference in their entirety.

FIELD

The present invention relates to a solid-state imaging device which converts incident light into an electric signal and outputs the electric signal as a video signal.

BACKGROUND

Solid-state imaging devices which convert incident light into electric signals and output the electric signals as video signals have been known. Digital still cameras have also been known which display an image based on the video signals obtained from the solid-state imaging devices. In recent years, higher-resolution and higher-speed in transferring electric charges are required for cameras using the solid-state imaging devices, for further improving an image quality and functions.

In such solid-state imaging devices, thinning out pixels of which signal charges are read are proposed in order to improve the output speed of video signals. In addition, a method which reduces the number of pixels of output video signals by mixing a plurality of signal charges, and a method which improves the speed (frame rate) of outputting video signals by providing a plurality of rows (at least two rows) of horizontal transfer units are proposed (see Patent Literature 1, for example).

FIG. 8 is a plan view which illustrates an example of the configuration of a solid-state imaging device 400 in which a conventional charge coupled device (CCD) is used. This view shows an example of a two-row configuration of horizontal transfer units. The solid-state imaging device 400 includes a plurality of photoelectric conversion units PD arranged in a matrix in the vertical direction (downward in the diagram) and the horizontal direction (leftward in the diagram). In addition, vertical transfer units 430 which transfer, in the vertical direction, electric charges read from the photoelectric conversion units PD are provided beside the respective photoelectric conversion units PD.

A line memory LM which serves as a charge accumulation unit capable of temporarily accumulating the signal charges is connected to an end of each of the vertical transfer units 430. A first horizontal transfer unit 440a is connected to each of the line memory LM. In addition, a second horizontal transfer unit 440b is connected to the first horizontal transfer unit 440a with a horizontal internal transfer unit 450 being disposed in between. An output amplifier AMP1 which outputs the signal charges is provided at a horizontal end of the first horizontal transfer unit 440a, and an output amplifier AMP2 which outputs the signal charges is provided at a horizontal end of the second horizontal transfer unit 440b.

In addition, a driving unit (not illustrated) is provided in the solid-state imaging device 400. The driving unit supplies a transfer driving pulse to each of the vertical transfer unit 430, the first horizontal transfer unit 440a, the second horizontal transfer unit 440b, and the horizontal internal transfer unit 450.

CITATION LIST

Patent Literature

[PTL 1] Japanese Unexamined Patent Application Publication No. 2009-290722

SUMMARY

Technical Problem

However, the above-described conventional technique poses a problem of deterioration in other features of the solid-state imaging device in trade for smoothly transferring signal charges between the horizontal transfer units.

Thus, the present invention has been conceived in view of the above-described problem, and aims to provide a solid-state imaging device capable of preventing deterioration in other features even when the transfer between the horizontal transfer units is smoothly performed.

Solution to Problem

In order to solve the above described problem, a solid-state imaging device according to an aspect of the present invention includes: a plurality of photoelectric conversion units arranged in rows and columns in a pixel region of a semiconductor substrate, and configured to convert incident light into signal charges; a plurality of vertical transfer units arranged for corresponding columns of the photoelectric conversion units, and configured to transfer, in a column direction, the signal charges read from the corresponding columns of the photoelectric conversion units; n horizontal transfer units arranged in parallel, and configured to transfer, in a row direction, the signal charges transferred by the vertical transfer units, n being an integer greater than or equal to two; and output units configured to output, as electric signals, the signal charges transferred by the n horizontal transfer units, the output units including n floating diffusion units each formed in a region adjacent to an output end of a corresponding one of the n horizontal transfer units, wherein the n floating diffusion units are disposed at greater intervals than adjacent ones of the n horizontal transfer units.

According to the above-described configuration, the spacing between the floating diffusion units in the output units is widely maintained, and thus it is possible to prevent occurrence of crosstalk in the output units. It is therefore possible to prevent occurrence of crosstalk between the output units even when the electrode width (length in the vertical direction) of the horizontal transfer units are reduced in order to secure the transfer performance between the horizontal transfer units, and thus a signal of a proper level according to the amount of incident light can be outputted.

In addition, the solid-state imaging device may further include (n−1) horizontal internal transfer units each interposed between respective adjacent ones of the n horizontal transfer units, and configured to selectively transfer the signal charges between the n horizontal transfer units.

According to the above-described configuration, it is possible to smoothly transfer signal charges between a plurality of horizontal transfer units.

In addition, at least one of the n horizontal transfer units may be bent at an end portion which includes the output end.

This allows securing an interval between a plurality of output units by bending the horizontal transfer units, and thus it is possible to maintain the spacing further widely between the floating diffusion units. It is therefore possible to further present occurrence of crosstalk between the output units. In addition, since the horizontal transfer unit is bent at the end portion, the distance between the horizontal transfer units can be reduced in a region adjacent to the pixel region, and thus it is possible to smoothly transfer the signal charges between the horizontal transfer units.

In addition, at least one of the n horizontal transfer units may include an end portion which includes the output end, and the end portion has a width in the column direction which increases toward the output end.

According to the above-described configuration, the intervals between the plurality of output units can be secured by broadening the width of each of the horizontal transfer units in the column direction, and thus it is possible to maintain greater intervals between the floating diffusion units. It is therefore possible to further present occurrence of crosstalk between the output units. In addition, since the width is broadened at the end portion, the distance between the horizontal transfer units can be reduced in a region adjacent to the pixel region, and thus it is possible to smoothly transfer the signal charges between the horizontal transfer units.

In addition, the n horizontal transfer units may be two horizontal transfer units, and the two horizontal transfer units may be vertically symmetrically bent at end portions each including the output end, or each have a width in the column direction, which increases toward the output end.

According to the above-described configuration, it is possible to equalize the length of the paths through which the signal charges are transferred between the horizontal transfer units, and thus the difference between channels which arises from a transfer failure during charge transfer or the like can be prevented.

In addition, the vertical transfer units may have transfer electrodes which are supplied with power from shunt lines arranged along the column direction, and the solid-state imaging device may further include: an optical black region (i) formed in a region adjacent to the pixel region and (ii) covered by a light-shield film, the optical black region outputting a signal of a black level; and a line region (i) formed in a region adjacent to the optical black region and (ii) covered by the light-shield film, the line region including dummy pixels, wherein a distance between the n horizontal transfer units and one of the dummy pixels which is included in the line region and positioned closest to the n horizontal transfer units may be larger than a distance between the n horizontal transfer units and one of pixels included in the optical black region and positioned closest to the n horizontal transfer units, and at least one of the n horizontal transfer units may be bent toward the pixel region or has a width in the column direction which increases, at an end portion which includes the output end.

According to the above-described configuration, it is possible to enhance the uniformity of effective pixels disposed in the pixel region, by disposing the dummy pixel. In addition, it is possible to secure a space for bending or broadening the width of the horizontal transfer units, by disposing a dummy pixel positioned closest to the horizontal transfer units so as to be spaced further apart, from the horizontal transfer units, than a pixel positioned closest to the horizontal transfer units in the pixel region. This allows disposing the floating diffusions in the output units at greater intervals, and thus it is possible to further prevent occurrence of crosstalk. In addition, the n horizontal transfer units may be driven in an m-phase drive system where m is an integer greater than or equal to three.

This allows securing the amount of saturating signal charges more easily than the case of the two-phase drive system. It is preferable to reduce the electrode width (the width in the vertical direction) in order to smoothly perform transferring between the horizontal transfer units. However, when the electrode width is reduced, the amount of saturating signal charges which are the amount of charges that can be accumulated by one electrode further decreases. Contrary to the above, since the degree of freedom in adjusting the height of the potential barrier increases by driving the horizontal transfer units in three or more phases, it is possible to secure the amount of saturating signal charges.

In addition, the n horizontal transfer units may be configured to read and transfer the signal charges in an interlace system.

This configuration allows the gate width for securing the amount of saturating signal charges to be further smaller, and thus it is possible, for example, (i) to lower power consumption by reducing terminal capacity, and (ii) to obtain an excellent transfer characteristic between the channels because the distance of transferring in the vertical direction is reduced.

In addition, the solid-state imaging device may further include well contacts disposed between adjacent ones of the n floating diffusion units.

The above-described configuration allows noise generated in each of the output amplifiers to be absorbed by the group of well contacts, thereby further facilitating prevention of crosstalk between the channels.

In addition, all or part of wells for output amplifiers may be separated between the output amplifiers, each of the output amplifiers including a corresponding one of the n floating diffusion units.

According to the above-described configuration, it is possible to prevent a noise component generated in each of the output amplifiers from being included in a signal of another channel via the well, by separating the wells, and thus crosstalk can be prevented.

Advantageous Effects

According to the present invention, it is possible to prevent deterioration in other features of a solid-state imaging device even when the transfer between the horizontal transfer units is smoothly performed.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENT

Embodiments according to the present invention will be described below with reference to the drawings.

Embodiment 1

A solid-state imaging device according to Embodiment 1 of the present invention includes: a plurality of photoelectric conversion units; a plurality of vertical transfer units which are provided so as to correspond to the columns of the photoelectric conversion units and transfer, in a column direction, signal charges that are read from the corresponding photoelectric conversion units; and n horizontal transfer units which are arranged in parallel and transfer, in a row direction, the signal charges transferred by the vertical transfer units, where n is an integer greater than or equal to two. In addition, the solid-state imaging device according to Embodiment 1 is characterized by further including: n floating diffusion units each of which is formed in a region adjacent to an output end of a corresponding one of the n horizontal transfer units; and output units which output, as electric signals, the signal charges transferred by the n horizontal transfer units, and characterized in that the n floating diffusion units are disposed at greater intervals than adjacent ones of the horizontal transfer units.

Figure 1:
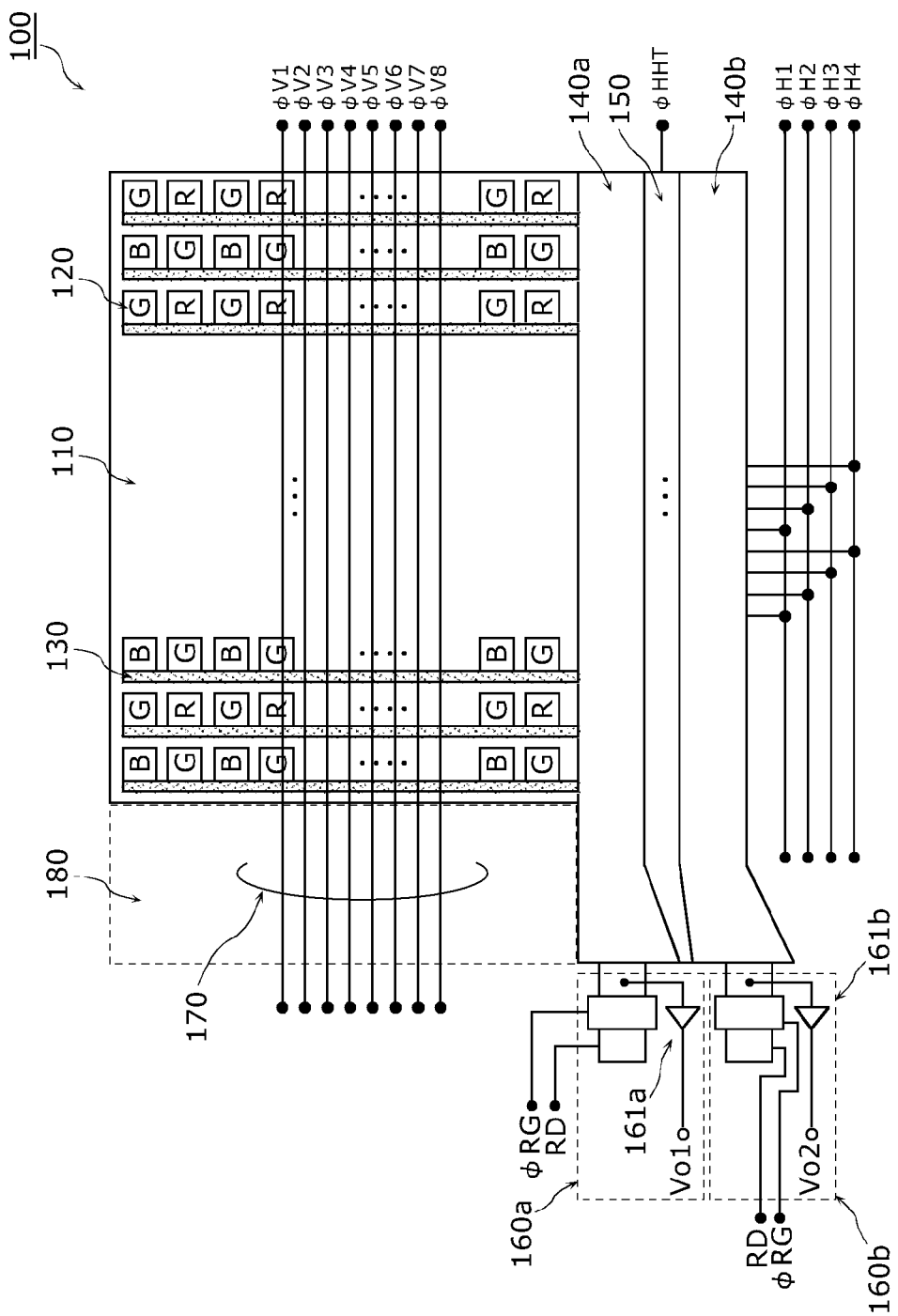
FIG. 1 is a configuration diagram which illustrates an example of a solid-state imaging device according to Embodiment 1 of the present invention.

FIG. 1 is a configuration diagram which illustrates an example of a solid-state imaging device 100 according to Embodiment 1 of the present invention.

The solid-state imaging device 100 according to Embodiment 1 of the present invention includes: a pixel unit 110; a plurality of photoelectric conversion units 120; a plurality of vertical transfer units 130; a first horizontal transfer unit 140a; a second horizontal transfer unit 140b; a horizontal internal transfer unit 150; a first output unit 160a; and a second output unit 160b. To be more specific, the solid-state imaging device 100 is a solid-state imaging device of a CCD type that includes: vertical transfer electrodes V1 to V8 formed in a single layer (not illustrated); and horizontal transfer electrodes H1 to H4 formed also in a single layer (not illustrated), and is driven by driving pulses ϕV1 to ϕV8 and ϕH1 to ϕH4. The solid-state imaging device 100 illustrated in FIG. 1 includes two output units, and thus image signals of two channels can be outputted. The above-described vertical transfer electrodes and the horizontal transfer electrodes are formed by conductive films such as polysilicon films of a single layer, for example.

In addition, in order to apply the driving pulses ϕV1 to ϕV8 to the vertical transfer units 130, horizontal shunt lines 170 are extended in a horizontal direction in such a manner so as to avoid passing above photodiodes, as illustrated in FIG. 1. Tungsten is used for forming the horizontal shunt lines 170, for example.

The pixel unit 110 includes the plurality of photoelectric conversion units 120 and the plurality of vertical transfer units 130.

The photoelectric conversion units 120 are arranged in rows and columns (in other words, two-dimensionally arranged) in a pixel region and convert incident light into signal charges. The pixel region is a region in which the pixel unit 110 is formed.

The vertical transfer units 130 are provided so as to correspond to the columns of the photoelectric conversion units 120, and transfer signal charges generated by the photoelectric conversion units 120, in the column direction; that is, the vertical direction (downward in the diagram). The vertical transfer units 130 includes the vertical transfer electrodes V1 to V8 and are driven by the driving pulses ϕV1 to ϕV8, thereby transferring the signal charges generated by the photoelectric conversion units 120 to the first horizontal transfer unit 140a.

It is to be noted that, although it is not illustrated here, a transfer unit may be provided between the pixel unit 110 and the first horizontal transfer unit 140a to hold or transfer signal charges on the way of being transferred from the pixel unit 110 to the first horizontal transfer unit 140a, for example. Then, the transfer unit may control the progression of the signal charges.

The photoelectric conversion units 120 are, for example, photodiodes which generate signal charges according to incident light. Each of the photoelectric conversion units 120 includes a corresponding one of the color filters of three colors, that is, red (R), green (G), and blue (B). In Embodiment 1 of the present invention, each of the color filters of RGB is periodically disposed every other pixel in each of the vertical direction and the horizontal direction. In other words, each of the pixels of RGB is disposed in a checkered pattern.

The vertical transfer units 130 are provided so as to correspond to the columns of the photoelectric conversion units 120, and transfer, in the vertical direction, the signal charges read from the corresponding photoelectric conversion units 120. The vertical transfer units 130 are driven in eight phases, for example, and transfer, in the vertical direction, the signal charges generated by the photoelectric conversion units 120, according to the driving pulses ϕV1 to ϕV8.

The first horizontal transfer unit 140a and the second horizontal transfer unit 140b transfer, in the row direction; that is, the horizontal direction (leftward in the diagram), the signal charges transferred by the vertical transfer units 130. As shown in FIG. 1, the first horizontal transfer unit 140a and the second horizontal transfer unit 140b are arranged in parallel to each other.

According to Embodiment 1 of the present invention, the first horizontal transfer unit 140a and the second horizontal transfer unit 140b are driven in four phases in order to smoothly transfer, without a transfer failure, charges from the vertical transfer units 130 through the first horizontal transfer unit 140a and the horizontal internal transfer unit 150 to the second horizontal transfer unit 140b. To be more specific, each of the first horizontal transfer unit 140a and the second horizontal transfer unit 140b has the horizontal transfer electrodes H1 to F4, and transfers, in the horizontal direction, the signal charges transferred by the vertical transfer units 130 according to the driving pulses φH1 to φH4.

The horizontal internal transfer unit 150 is disposed between the first horizontal transfer unit 140a and the second horizontal transfer unit 140b, and selectively transfers the signal charges between the first horizontal transfer unit 140a and the second horizontal transfer unit 140b.

Each of the first output unit 160a and the second output unit 160b includes the floating diffusion unit formed in the region in contact with the output end of a corresponding one of the first horizontal transfer unit 140a and the second horizontal transfer unit 140b. Each of the first output unit 160a and the second output unit 160b outputs, as electric signals, signal charges transferred by the corresponding one of the first horizontal transfer unit 140a and the second horizontal transfer unit 140b.

More specifically, the first output unit 160a and the second output unit 160b convert, into voltages, the signal charges transferred by the first horizontal transfer unit 140a and the second horizontal transfer unit 140b, and output the voltages. The first output unit 160a is provided with a first output amplifier 161a that includes a first floating diffusion unit. The second output unit 160b is provided with a second output amplifier 161b that includes a second floating diffusion unit. In addition, although the operation is not described in detail here, a pulse φRG and a voltage RD which are necessary for the operation are also applied to these output units.

The first floating diffusion unit and the second floating diffusion unit are disposed at a greater interval than the first horizontal transfer unit 140a and the second horizontal transfer unit 140b. It is to be noted that, the interval between the first horizontal transfer unit 140a and the second horizontal transfer unit 140b corresponds to the width (a length in the vertical direction) of the horizontal internal transfer unit 150, for example. More specifically, the first floating diffusion unit and the second floating diffusion unit are formed with a greater spacing being provided in between than the width of the horizontal internal transfer unit 150.

According to the above-described configuration, the solid-state imaging device 100 according to Embodiment 1 of the present invention is capable of maintaining a certain distance or larger, between the output amplifiers which include the floating diffusion units, and thus interference of a signal (crosstalk) between channels is prevented. As a result, each of the channels outputs, as an output signal, a signal which is free from interference of an unnecessary signal and has a proper level according to the amount of incident light.

It is to be noted that at least one of the first horizontal transfer unit 140a and the second horizontal transfer unit 140b may be bent at an end portion which includes the output end, as shown in FIG. 1.

To be more specific, the first horizontal transfer unit 140a is bent in a manner such that the width in the column direction gradually increases, at a region over (i) a pixel region in which effective pixels (that is, the pixel unit 110) are formed and (ii) an optical black (OB) region which is light-shielded and outputs a signal of a black level, toward the output end.

In addition, the second horizontal transfer unit 140b is bent along the bend of the first horizontal transfer unit 140a. At this time, the degree of bend (angle or gradient) may differ between the first horizontal transfer unit 140a and the second horizontal transfer unit 140b. As shown in FIG. 1, for example, the second horizontal transfer unit 140b may be bent more greatly than the first horizontal transfer unit 140a. The above-described configuration allows enlarging the interval between the output end of the first horizontal transfer unit 140a and the output end of the second horizontal transfer unit 140b, and thus it is possible to maintain a certain distance or larger between the output amplifiers including the floating diffusion units.

Here, it is more preferable that the width of each of the first horizontal transfer unit 140a and the second horizontal transfer unit 140b is increased than that each of the first horizontal transfer unit 140a and the second horizontal transfer unit 140b is simply bent.

The signal charges transmitted though the vertical transfer unit 130, the first horizontal transfer unit 140a, and the second horizontal transfer unit 140b, are transferred to the floating diffusion units provided in the first output unit 160a and the second output unit 160b. The first output unit 160a and the second output unit 160b detect potential variation of the respective floating diffusion units using an MOS (metal oxide semiconductor) transistor, convert the detected potential variation into electric signals, and amplify the electric signals, thereby outputting the electric signals from output terminals Vo1 and Vo2.

The first horizontal transfer unit 140a and the second horizontal transfer unit 140b are driven in four phases, and thus require smaller widths (a length in the vertical direction) for electrodes than the widths required in the case of the two-phase drive system, for securing the same amount of saturating signal charges. However, since the width of each of the electrode is small, a distance between the channels, that is, a distance between the horizontal transfer units is reduced. As a result, with the conventional configuration, the output amplifiers including the floating diffusion units are positioned closer to each other. This means that signal crosstalk is likely to occur between the channels.

In view of the above, in Embodiment 1 of the present invention, the first horizontal transfer unit 140a and the second horizontal transfer unit 140b are bent and the respective widths are increased, thereby enlarging the distance between the output amplifiers. It is therefore possible to prevent the occurrence of crosstalk.

It is to be noted that, the solid-state imaging device 100 according to Embodiment 1 of the present invention may include a line region 180 indicated by a dotted line that surrounds the line region 180. The line region 180 may be provided with, instead of the photodiodes, a dummy pixel which is used for enhancing the uniformity of quality of the effective pixels. The dummy pixel is covered with a light-shield film.

When the dummy pixel is disposed in the line region 180, since the driving pulses of φV1 to φV8 are applied from the horizontal shunt lines 170 extending in the horizontal direction to the transfer electrodes of the vertical transfer units 130 in the pixel unit 110, one side (the upper side in the diagram) of the first horizontal transfer unit 140a cannot be bent due to the horizontal shunt line 170 formed thereabove. In addition, since it is necessary to provide bus lines (not illustrated) of φV1 to φV8 for feeding power to the horizontal shunt lines 170 even when the dummy pixel is not disposed, for example, the first horizontal transfer unit 140a cannot be bent to the one side (the upper side in the diagram) for providing a line space.

It is to be noted that, although it is not illustrated, the dummy pixel may be disposed not only in the line region 180 surrounded by the dotted line but also above the pixel unit 110 (an upper portion in the diagram) or to the right of the pixel unit 110 (a right portion in the diagram). It is possible to further enhancing the uniformity within the effective pixel unit by providing the dummy pixel.

It is to be noted that, each of the first horizontal transfer unit 140*a* and the second horizontal transfer unit 140*b* may have an interlace reading out configuration. This configuration allows the gate width for securing the amount of saturating signal charges to be further smaller, and thus it is possible, for example, (i) to lower power consumption by reducing terminal capacity, and (ii) to obtain an excellent transfer characteristic between the channels because the distance of transferring in the vertical direction is reduced.

Figure 2:
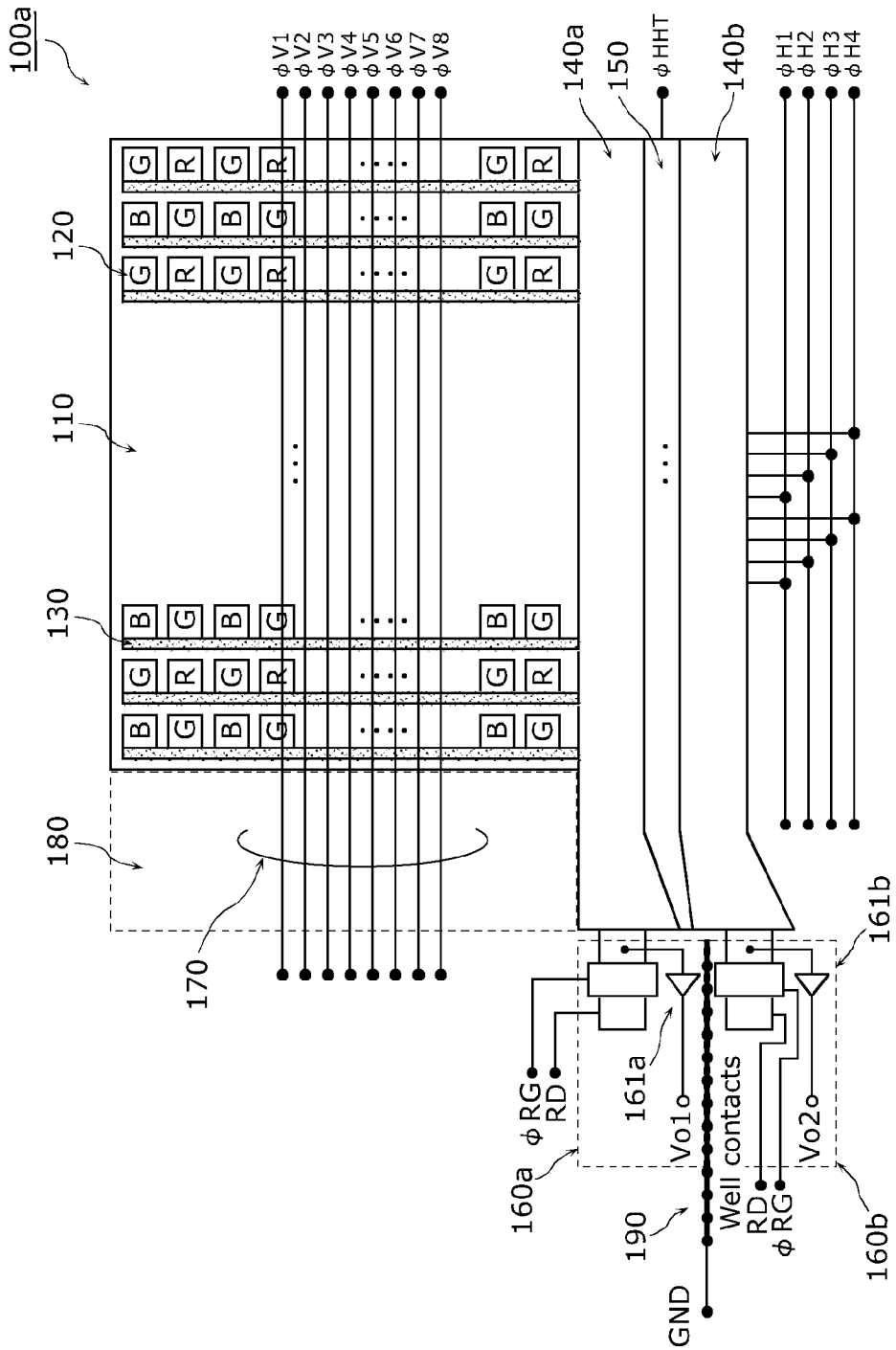
FIG. 2 is a configuration diagram which illustrates an example of a solid-state imaging device according to a modification example of Embodiment 1 of the present invention.

In addition, when there is a sufficient distance between the first output amplifier 161*a* and the second output amplifier 161*b*, it is preferable to depose a group of well contacts 190 between the first output amplifier 161*a* and the second output amplifier 161*b*, as in the solid-state imaging device 100*a* illustrated in FIG. 2. The above-described configuration allows noise generated in each of the output amplifiers to be absorbed by the group of well contacts 190, thereby further facilitating prevention of crosstalk between the channels.

Alternatively, all or part of the wells for the first output amplifier 161*a* and the second output amplifier 161*b* may be separately formed. It is possible to prevent a noise component generated in each of the output amplifiers from being included in a signal of another channel via the well, and it is therefore effective for the prevention of crosstalk.

It is to be noted that, although the horizontal transfer unit is driven in four phases according to Embodiment 1 of the present invention, a multiphase drive of m-phase or more (m is an integer of three or greater) is sufficiently effective for preventing a transfer failure between the horizontal transfer units because it is possible to reduce the electrode width compared to the conventional two-phase drive.

As described above, the solid-state imaging device according to Embodiment 1 of this disclosure includes: a plurality of photoelectric conversion units arranged in rows and columns in a pixel region of a semiconductor substrate, and configured to convert incident light into signal charges; a plurality of vertical transfer units arranged for corresponding columns of the photoelectric conversion units, and configured to transfer, in a column direction, the signal charges read from the corresponding columns of the photoelectric conversion units; n horizontal transfer units arranged in parallel, and configured to transfer, in a horizontal direction, the signal charges transferred by the vertical transfer units; and output units configured to output, as electric signals, the signal charges transferred by the n horizontal transfer units, the output units including n floating diffusion units each formed in a region adjacent to an output end of a corresponding one of the n horizontal transfer units, and output amplifiers including the n floating diffusion units are disposed at greater intervals than adjacent ones of the n horizontal transfer units.

To be more specific, the solid-state imaging device according to Embodiment 1 of the present invention includes at least one of the plurality of horizontal transfer units which is bent at the end portion which includes the output end. More preferably, in the end potion which includes the output end of at least one of the plurality of horizontal transfer units, the width in the column direction increases toward the corresponding output unit.

According to the above-described configuration, it is possible to maintain a certain distance or larger, between the output amplifiers which include the floating diffusion (FD) units of the respective channels, and thus interference of a signal (crosstalk) between channels is prevented. As a result, each of the channels outputs, as an output signal, a signal which is free from interference of an unnecessary signal and has a proper level according to the amount of incident light.

Therefore, it is possible to provide a solid-state imaging device capable of reducing the effects of crosstalk between the channels and obtaining a proper level, while preventing the increase in power consumption and a transfer failure between the horizontal transfer units.

Embodiment 2

The following describes a solid-state imaging device according to Embodiment 2 of the present invention, focusing on a difference from Embodiment 1.

The solid-state imaging device according to Embodiment 2 of the present invention differs, from the solid-state imaging device according to Embodiment 1, in the configuration of shunt lines in the pixel unit. Meanwhile, in the same manner as the solid-state imaging device according to Embodiment 1, the solid-state imaging device according to Embodiment 2 of the present invention is capable of maintaining the distance between the first output unit and the second output unit, reducing the effect of crosstalk caused by a signal of the other output unit, and obtaining a proper level according to the amount of incident light.

Figure 3:
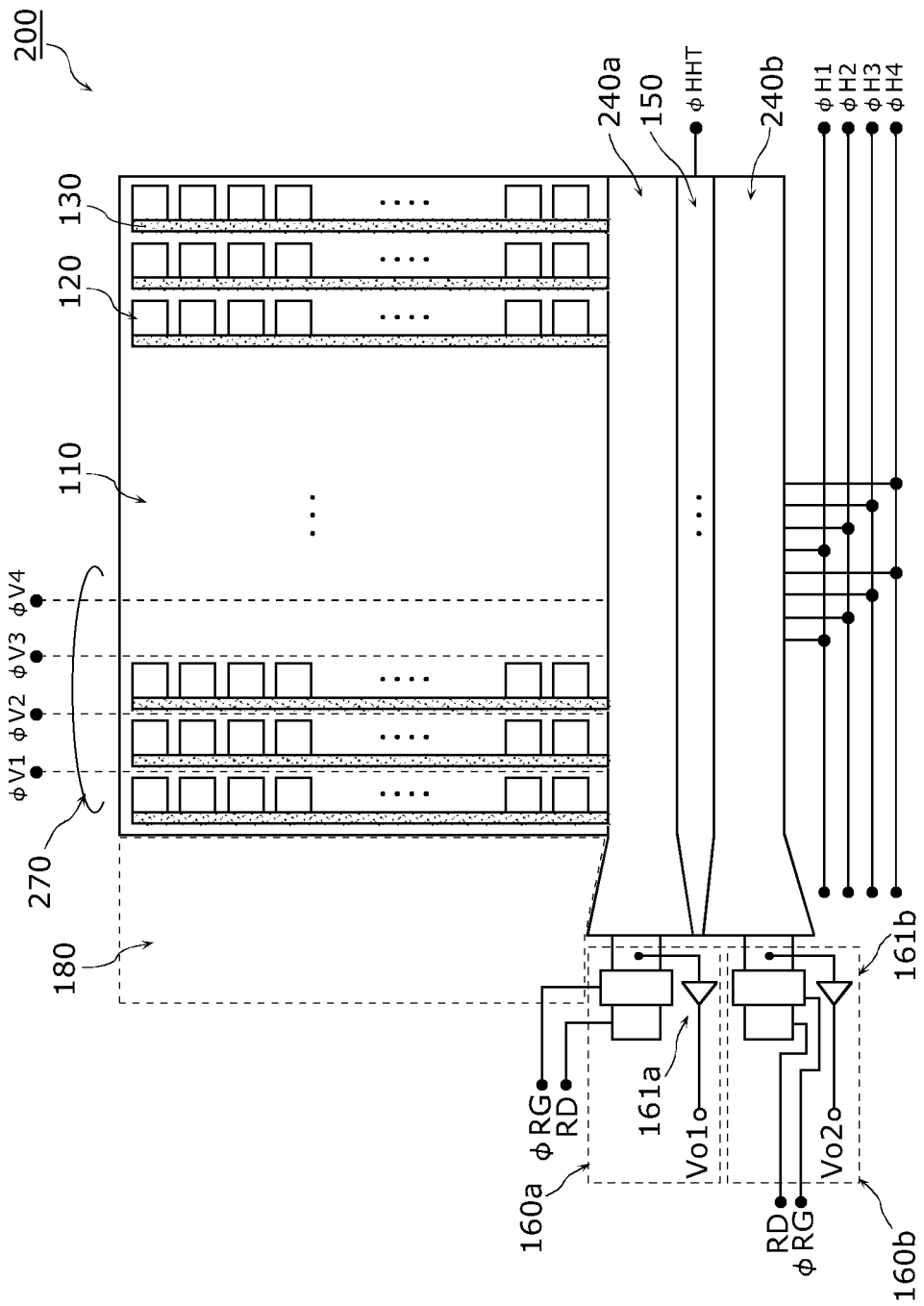
FIG. 3 is a configuration diagram which illustrates an example of a solid-state imaging device according to Embodiment 2 of the present invention.

FIG. 3 is a configuration diagram which illustrates an example of a solid-state imaging device 200 according to Embodiment 2 of the present invention. As shown in FIG. 3, the solid-state imaging device 200 is different from the solid-state imaging device 100 in FIG. 1 according to Embodiment 1, in that the solid-state imaging device 200 includes: a first horizontal transfer unit 240*a* and a second horizontal transfer unit 240*b* instead of the first horizontal transfer unit 140*a* and the second horizontal transfer unit 140*b*; and vertical shunt lines 270 instead of the horizontal shunt lines 170.

To be more specific, the solid-state imaging device 200 illustrated in FIG. 3 is almost identical to the solid-state imaging device 100 according to Embodiment 1, however, the vertical shunt lines 270 for applying driving pulses to the transfer electrodes of the vertical transfer units 130 in the pixel unit 110 extend not in the horizontal direction but in the vertical direction. In addition, each of the first horizontal transfer unit 240*a* and the second horizontal transfer unit 240*b* is bent and broadened toward the pixel unit 110, in an end portion toward a corresponding one of the first output unit 160*a* and the second output unit 160*b*. This configuration allows the output amplifiers including the floating diffusion units of the respective channels to be spaced apart, thereby preventing crosstalk. The following describes mainly the difference from Embodiment 1, and the description for the same points is omitted.

The vertical transfer units 130 are driven in four phases, and transfer, in the vertical direction, signal charges according to the driving pulses $\phi V1$ to $\phi V4$. The vertical shunt lines 270 which extend in the vertical direction are arranged in such a manner so as to avoid passing above photodiodes, using a space such as a portion above the vertical transfer units 130 and an isolation portion between the pixels. Aluminium is used for the shunt lines, for example. The following describes the advantageous effect of using, unlike Embodiment 1, the vertical shunt lines In Embodiment 1, since the horizontal shunt lines are used in the configuration, the shunt lines and bus lines need to be disposed in the line region 180 surrounded by the dotted line.

On the other hand, in the case where the vertical shunt lines are used in the configuration as in Embodiment 2 of the present invention, the bus lines can be disposed above (not illustrated) the pixel unit 110, and thus it is not necessary to dispose the bus lines in the line region 180.

Also, even in the case where a dummy pixel is disposed in the line region 180 in order to enhance the uniformity of the effective pixel unit, since the vertical shunt lines 270 used for applying driving pulses to the transfer electrodes extend in the vertical direction, the shunt lines need not necessarily be disposed in the line region 180 entirely in the vertical direction in all of the columns, as long as the vertical transfer electrodes are formed to extend in the horizontal direction so as to avoid passing above the photodiodes, for example. It is also possible, for example, to remove the dummy pixels for several bits positioned closest to the first horizontal transfer unit 240a.

Figure 4:
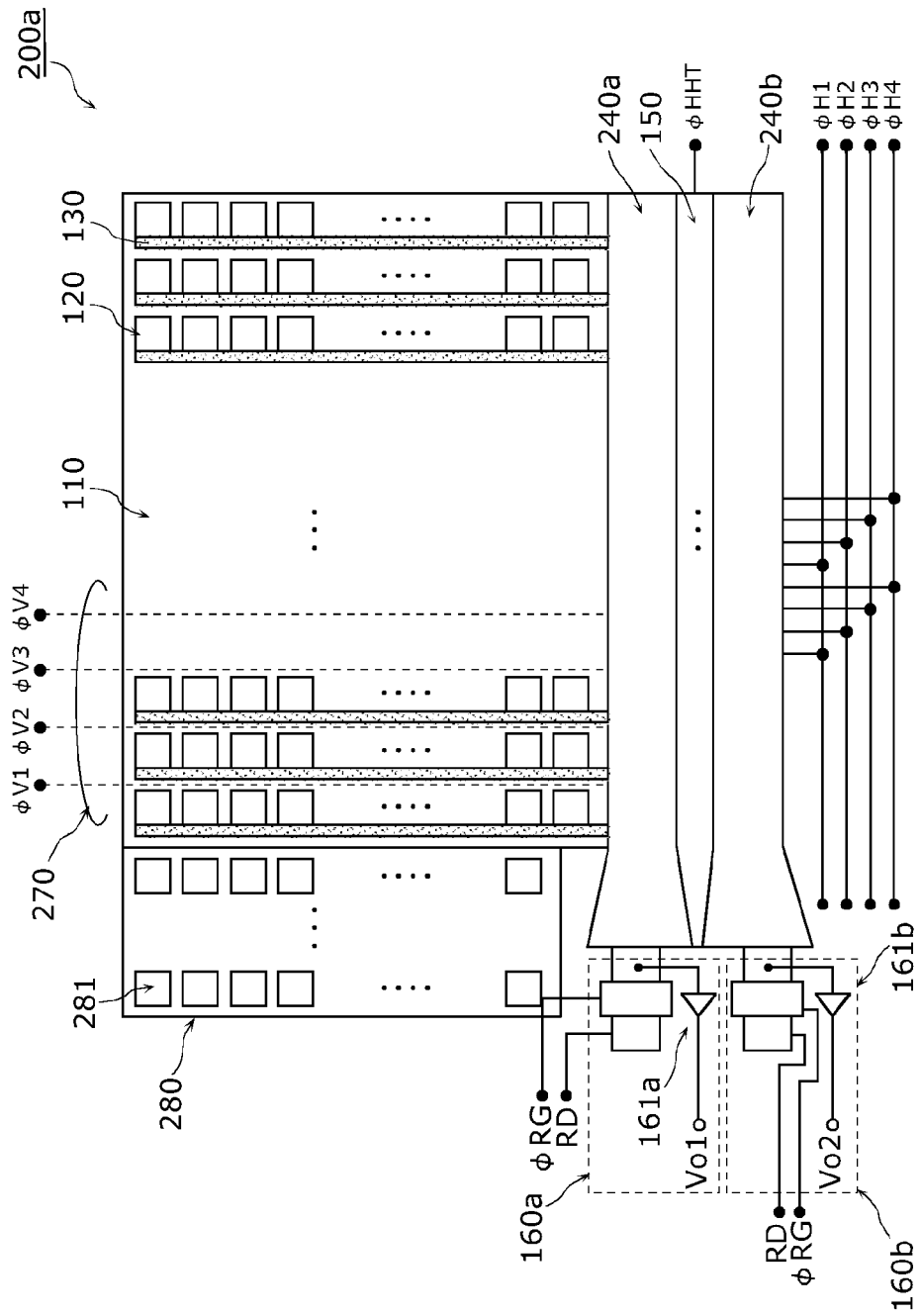
FIG. 4 is a configuration diagram which illustrates an example of the solid-state imaging device according to Embodiment 2 of the present invention.

FIG. 4 is a diagram which illustrates an example of the configuration of a solid-state imaging device 200a when the dummy pixels are removed for one bit, for example. As shown in FIG. 4, the solid-state imaging device 200a includes a plurality of dummy pixels 281 arranged in rows and columns in the line region 280. As further shown in FIG. 4, among the dummy pixels 281 disposed in the line region 280, dummy pixels in a region close to the first horizontal transfer unit 240a (dummy pixels for one row) are removed.

It is to be noted that, FIG. 4 is a schematic view and an actual size of a pixel is significantly smaller than the pixel illustrated in the schematic view, and thus removing several bits is effective for securing a space for disposing the output units. Removing the dummy pixels facilitates bending or broadening the first horizontal transfer unit 240a toward the pixel unit 110, and thus it is also possible to dispose the first output unit 160a in a region close to the pixel unit 110.

In addition, as with Embodiment 2 of the present invention, it is only necessary that the number of horizontal transfer units is two and the first horizontal transfer unit 240a positioned close to the pixel unit 110 and the second horizontal transfer unit 240b positioned away from the pixel unit 110 are vertically symmetrically bent at portions close to the respective first output unit 160a and the second output unit 160b or the widths of the first horizontal transfer unit 240a and the second horizontal transfer unit 240b may increase in the column direction. According to the configuration described above, when taking a transfer path of each of the horizontal transfer units into consideration, charges move in paths that are vertically symmetric and thus the transfer distances are approximately the same, thereby allowing reducing the difference between channels due to a transfer failure during charge transfer, for example.

It is to be noted that, as with Embodiment 1, a group of well contacts may be disposed between the output amplifiers when the distance between the first output amplifier 161a and the second output amplifier 161b is sufficient. This allows further reduction of crosstalk in the same manner as Embodiment 1.

Alternatively, all or part of the wells for the first output amplifier 161a and the second output amplifier 161b may be separately formed. This can prevent a noise component from being included in a signal of another channel via the well, and it is therefore effective for the prevention of crosstalk In addition, although the horizontal transfer unit is driven in four phases in Embodiment 2 of the present invention as well, a multiphase drive of m-phase or more (m is an integer of three or greater) is sufficiently effective for preventing a transfer failure between the horizontal transfer units because it is possible to reduce the electrode width compared to the conventional two-phase drive system.

Here, an advantageous effect of the solid-state imaging device according to each of the embodiments described above will be described with reference to the drawings. First, a solid-state imaging device according to a comparison example of the embodiments of the present invention will be described with reference to the drawings.

Figure 5:
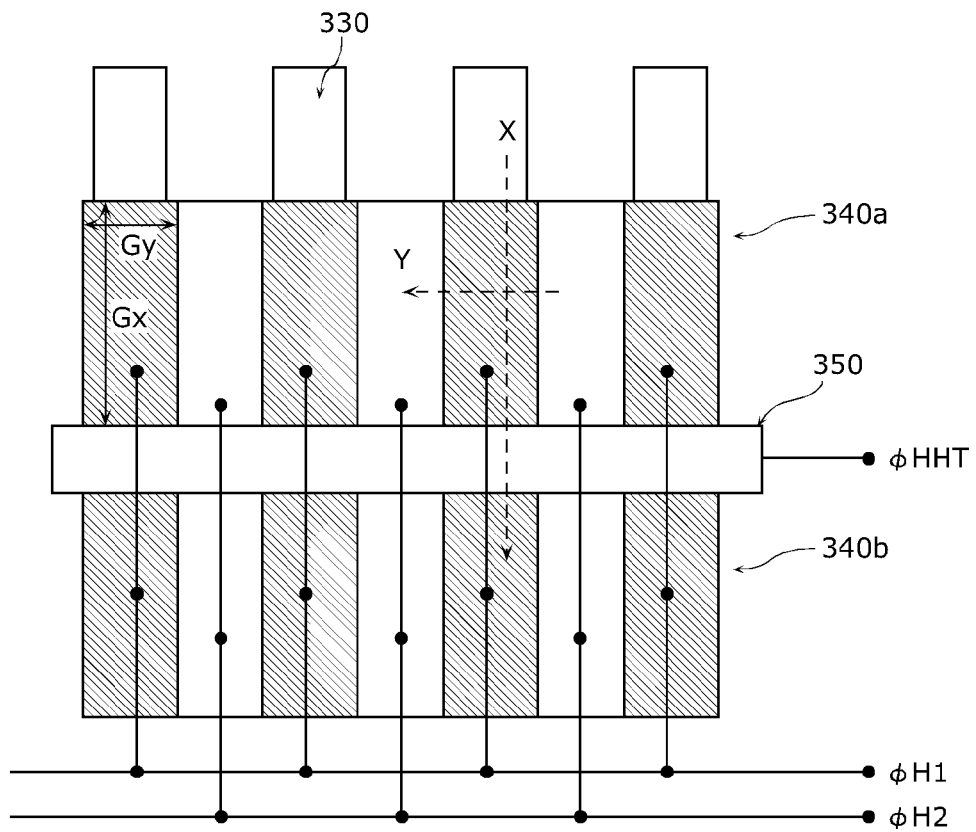
FIG. 5 is a diagram which illustrates an example of an electrode configuration for a two-phase drive system in the solid-state imaging device according to a comparison example of the embodiments of the present invention.

FIG. 5 is a diagram which illustrates a configuration of horizontal transfer units of a solid-state imaging device according to this comparison example. To be more specific, an electrode configuration in the case where the first horizontal transfer unit 340a and the second horizontal transfer unit 340b are driven in two phases is illustrated.

As shown in FIG. 5, in the case of charge transfer in the vertical direction, such as transferring a signal charge transmitted by the vertical transfer unit 330 through the first horizontal transfer unit 340a and the horizontal internal transfer unit 350 to the second horizontal transfer unit 340b (the path X in the diagram), it is necessary to transfer the signal charge without a transfer failure in one electrode though a distance Gx which is longer than a distance of the case of charge transfer in the horizontal direction in the first horizontal transfer unit 340a (the path Y in the diagram). Therefore, increasing the electrode width Gx brings great disadvantages to the transfer between the horizontal transfer units, such as transmission of a signal from the first horizontal transfer unit 340a to the second horizontal transfer unit 340b. In general, the electrode width Gx in the vertical direction is several dozen times longer than the electrode length Gy in the horizontal direction.

This means that securing the amount of saturating signal charges of the first horizontal transfer unit 340a (increasing the electrode width Gx) is contradictory to implementing the transfer between the horizontal transfer units in the vertical direction without a failure (decreasing the electrode width Gx). Therefore, in order to combine the above-described two, it is conceivable that the first horizontal transfer unit 340a and the second horizontal transfer unit 340b are driven in a multiphase drive system, such as the four-phase drive system.

Figure 6A:
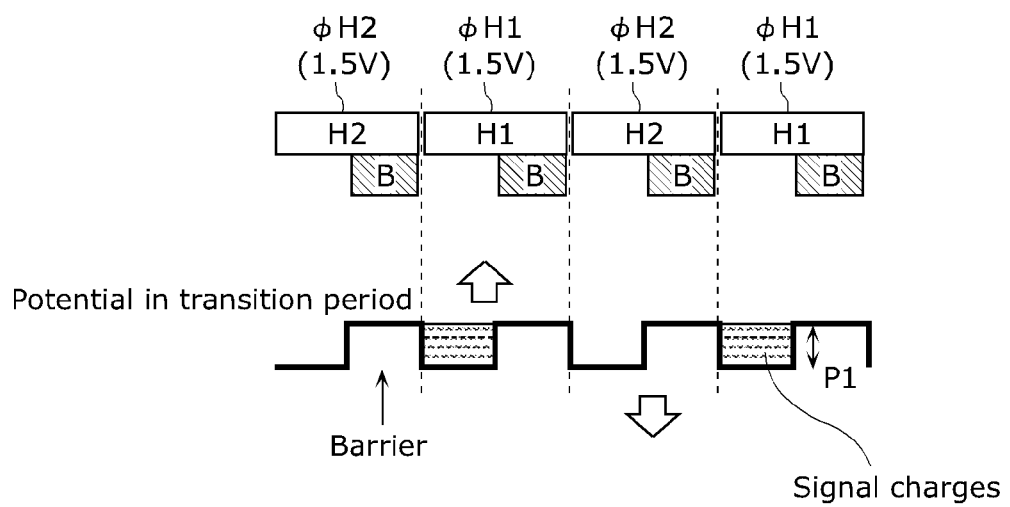
FIG. 6A is a diagram which illustrates an example of a potential in a transition period, in the two-phase drive system for the solid-state imaging device according to the comparison example of the embodiments of the present invention.

Next, FIG. 6A to FIG. 7B are diagrams of solid-state imaging devices according to this comparison example and indicate the differences between the two-phase dive system and the four-phase drive system. More specifically, FIG. 6A is a diagram which illustrates an example of a potential in a transition period, in the two-phase drive system for the solid-state imaging device according to the comparison example of the embodiments of the present invention. FIG. 6B is a diagram which illustrates an example of a potential in the transition period, in the four-phase drive system for the solid-state imaging device according to the comparison example of the embodiments of the present invention.

Figure 7A:
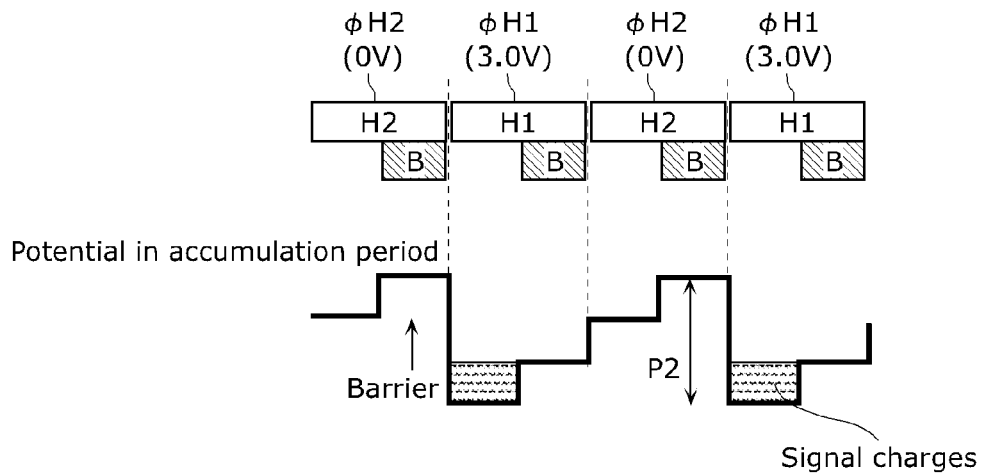
FIG. 7A is a diagram which illustrates an example of a potential in an accumulation period, in the two-phase drive system four the solid-state imaging device according to the comparison example of the embodiments of the present invention.
Figure 7B:
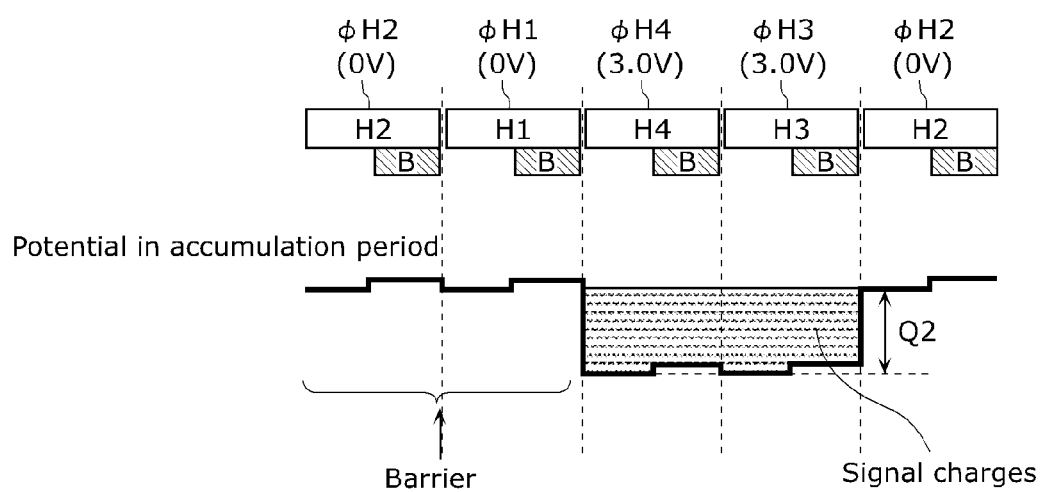
FIG. 7B is a diagram which illustrates an example of the potential in the accumulation period, in the four-phase drive system four the solid-state imaging device according to the comparison example of the embodiments of the present invention.
Figure 8:
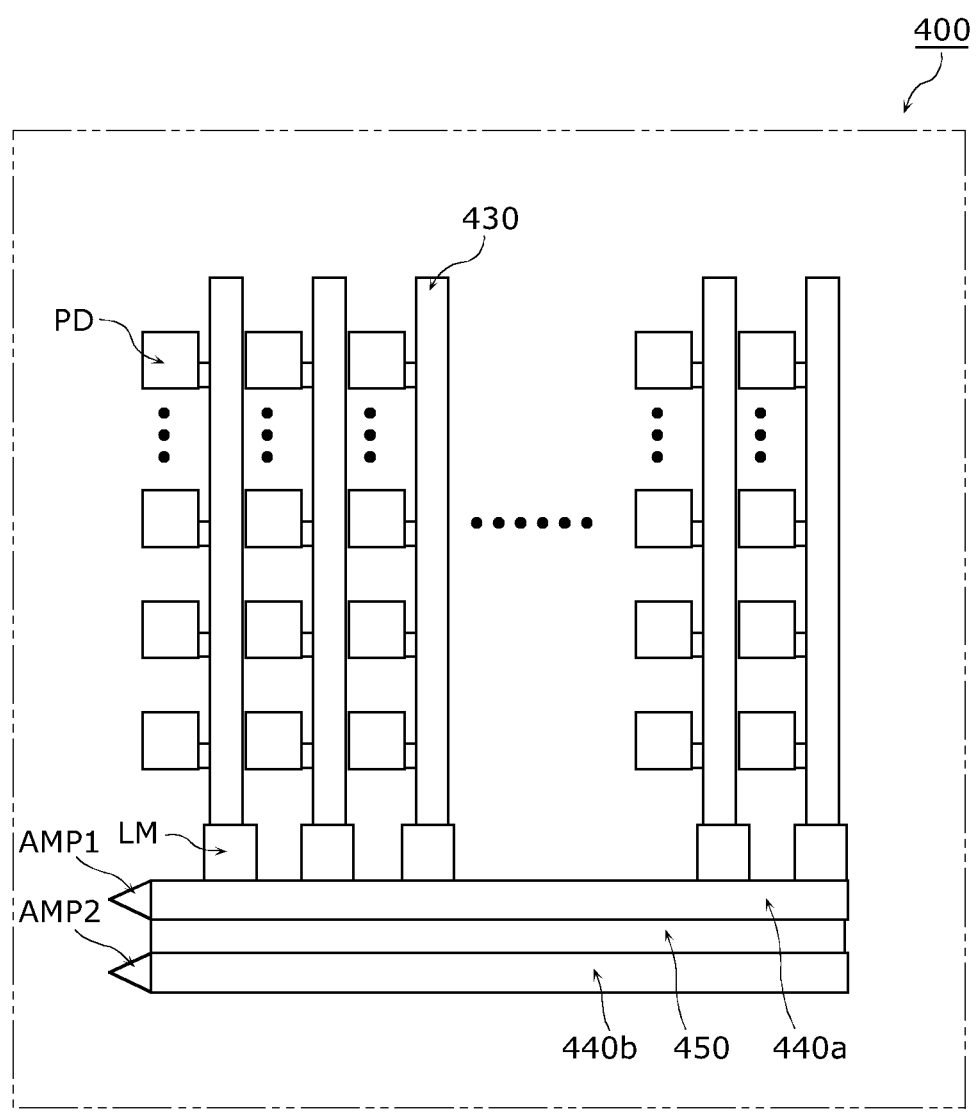
FIG. 8 is a configuration diagram which illustrates a schematic configuration of a conventional solid-state imaging device.

In addition, FIG. 7A is a diagram which illustrates an example of a potential in an accumulation period, in the two-phase drive system for the solid-state imaging device according to the comparison example of the embodiments of the present invention. FIG. 7B is a diagram which illustrates an example of a potential in the accumulation period, in the four-phase drive system for the solid-state imaging device according to the comparison example of the embodiments of the present invention.

As shown in FIG. 6A to FIG. 7B, each of the first horizontal transfer unit 340a and the second horizontal transfer unit 340b includes a plurality of charge transfer stages which are disposed in parallel in the horizontal direction and operate as a charge accumulation region or a barrier region according to the potential level of a driving voltage that is applied. The horizontal transfer unit performs drive control on an applied voltage and switches the positions between the charge accumulation region and the barrier region, thereby transferring the charges accumulated in the charge transfer stages to the output ends.

Figure 6B:
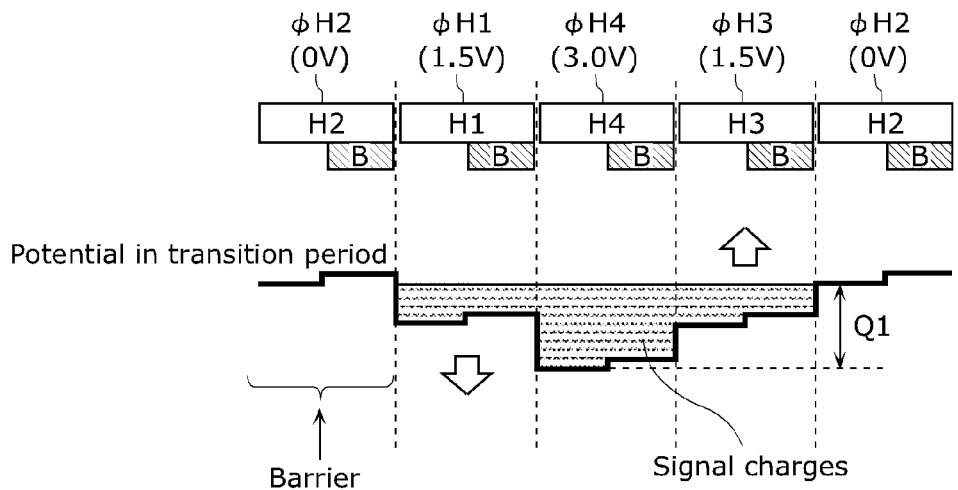
FIG. 6B is a diagram which illustrates an example of the potential in the transition period, in a four-phase drive system for the solid-state imaging device according to the comparison example of the embodiments of the present invention.

First, in the case of the two-phase drive system in which voltages of 0V and 3V are applied to the electrodes H1 and H2, the amount of saturating signal charges that can be accumulated is only the amount for one electrode which can be defined by P1 that is the height of a potential barrier, as shown in FIG. 6A. The level difference in the potential can be generated by ion implantation of Boron (B), for example. On the other hand, in the case of the four-phase drive system in which voltages of 0V and 3V are applied to the electrodes H1 to H4, it is possible, even in the same transition period, that only H1 and H3 have a transition voltage (1.5 V) while H2 maintains 0V and H4 maintains 3V, depending on how they are driven, as shown in FIG. 6B. The amount of saturating signal charges becomes the smallest at this time as in the case of the two-phase drive system, however, the amount of saturating signal charges is larger compared to the case of the two-phase drive system, and it is possible to accumulate several times as large signals as signals that can be accumulated for one electrode in the two-phase drive system, as shown in FIG. 6B. It is to be noted that, the potential barrier at this time can be defined by Q1.

On the other hand, when taking a potential in an accumulation period into consideration, the potential barrier can be defined by P2 in the two-phase drive system as shown in FIG. 7A, and P2 is a higher barrier than P1 shown in FIG. 6A. However, since the amount of signal charges that can be accumulated is determined by the transition period, the signal charges can be accumulated only for one electrode, as shown in FIG. 7A. On the other hand, in the case of the four-phase drive system, the potential barrier can be defined by Q2 as shown in FIG. 7B, and the height is the same as the height of Q1 shown in FIG. 6B.

As described above, when comparing the two-phase drive system and the four-phase drive system with electrodes having the same length and width, the amount of signal charges that can be accumulated during charge transfer is larger in the four-phase drive system. In view of the above, when accumulating the same amount of saturating signal charges in the four-phase drive system as the amount of saturating signal charges in the two-phase drive system, the width of the electrode may be drastically short. It is therefore possible to shorten the width of the electrode of the first horizontal transfer unit 340a by driving the first horizontal transfer unit 340a in the four-phase drive system, and thus transfer between the horizontal transfer units can be easily implemented.

However, when the width of the electrode of the first horizontal transfer unit 340a is reduced, the distance between the first horizontal transfer unit 340a and the second horizontal transfer unit 340b becomes short. This results in the output amplifiers being disposed closely, leading adversely to signal crosstalk occurring between the channels.

Contrary to this, the solid-state imaging device according to the above-described embodiments of the present invention is capable of securing the amount of saturating signal charges without causing deterioration in other features (crosstalk characteristics of signals). This is because, in the solid-state imaging device according to the above-described embodiments, the interval between the floating diffusion units included in the output units is greater than the spacing between the horizontal transfer units.

Although only some exemplary embodiments of the present invention have been described in detail above, those skilled in the art will readily appreciate that many modifications or forms structured by combining elements of different embodiments are possible in the exemplary embodiments without materially departing from the novel teachings and advantages of the present invention. Accordingly, all such modifications are intended to be included within the scope of the present invention.

In the above-described embodiments, for example, the horizontal transfer units are bent or broadened linearly; however, the horizontal transfer units may be bent or broadened with a curve or in a zig-zag manner.

In addition, two horizontal transfer units are provided in the above-described embodiments; however, n horizontal transfer units (n is greater than or equal to three), n output units each including a floating diffusion unit, and (n−1) horizontal internal transfer units may be provided.

In addition, the numerals described above are used for exemplification to specifically describe the present invention, and the present invention is not limited by the numerals used for exemplification. Furthermore, the material of each of the elements described above is used for exemplification to specifically describe the present invention, and the present invention is not limited by the materials used for exemplification. In addition, the relation of connection between the elements is used for exemplification to specifically describe the present invention, and the relation of connection which implements the functions of the present invention is not limited to this.

INDUSTRIAL APPLICABILITY

The present invention is applicable to a solid-state imaging device used for a video camera, a digital camera, a mobile phone with a camera, and so on.

The invention claimed is:

1. A solid-state imaging device comprising:
    a plurality of photoelectric conversion units arranged in rows and columns in a pixel region of a semiconductor substrate, and configured to convert incident light into signal charges;
    a plurality of vertical transfer units arranged for corresponding columns of the photoelectric conversion units, and configured to transfer, in a column direction, the signal charges read from the corresponding columns of the photoelectric conversion units;
    n horizontal transfer units arranged in parallel, and configured to transfer, in a row direction, the signal charges transferred by the vertical transfer units, n being an integer greater than or equal to two; and
    output units configured to output, as electric signals, the signal charges transferred by the n horizontal transfer units, the output units including n floating diffusion units each formed in a region adjacent to an output end of a corresponding one of the n horizontal transfer units,
    wherein the n floating diffusion units are disposed at greater intervals than adjacent ones of the n horizontal transfer units.

2. The solid-state imaging device according to claim 1, further comprising
    (n−1) horizontal internal transfer units each interposed between respective adjacent ones of the n horizontal transfer units, and configured to selectively transfer the signal charges between the n horizontal transfer units.

3. The solid-state imaging device according to claim 1, wherein at least one of the n horizontal transfer units is bent at an end portion which includes the output end.

4. The solid-state imaging device according to claim 1, wherein at least one of the n horizontal transfer units includes an end portion which includes the output end, and the end portion has a width in the column direction which increases toward the output end.

5. The solid-state imaging device according to claim 1, wherein the n horizontal transfer units are two horizontal transfer units, and the two horizontal transfer units are vertically symmetrically bent at end portions each including the output end, or each have a width in the column direction, which increases toward the output end.

6. The solid-state imaging device according to claim 1, wherein the vertical transfer units have transfer electrodes which are supplied with power from shunt lines arranged along the column direction, the solid-state imaging device further comprising:

an optical black region (i) formed in a region adjacent to the pixel region and (ii) covered by a light-shield film, the optical black region outputting a signal of a black level; and a line region (i) formed in a region adjacent to the optical black region and (ii) covered by the light-shield film, the line region including dummy pixels, wherein a distance between the n horizontal transfer units and one of the dummy pixels which is included in the line region and positioned closest to the n horizontal transfer units is larger than a distance between the n horizontal transfer units and one of pixels included in the optical black region and positioned closest to the n horizontal transfer units, and at least one of the n horizontal transfer units is bent toward the pixel region or has a width in the column direction which increases, at an end portion which includes the output end.

7. The solid-state imaging device according to claim 1, wherein the n horizontal transfer units are driven in an m-phase drive system where m is an integer greater than or equal to three.

8. The solid-state imaging device according to claim 1, wherein the n horizontal transfer units are configured to read and transfer the signal charges in an interlace system.

9. The solid-state imaging device according to claim 1, further comprising well contacts disposed between adjacent ones of the n floating diffusion units.

10. The solid-state imaging device according to claim 1, wherein all or part of wells for output amplifiers are separated between the output amplifiers, each of the output amplifiers including a corresponding one of the n floating diffusion units.

* * * * *